United States Patent
Pandey et al.

(10) Patent No.: US 9,871,044 B2
(45) Date of Patent: Jan. 16, 2018

(54) ENHANCED CHARGE STORAGE MATERIALS, RELATED SEMICONDUCTOR MEMORY CELLS AND SEMICONDUCTOR DEVICES, AND RELATED SYSTEMS AND METHODS

(71) Applicant: Micron Technology, Inc., Boise, ID (US)

(72) Inventors: Sumeet C. Pandey, Boise, ID (US); Gurtej S. Sandhu, Boise, ID (US); Wayne I. Kinney, Emmett, ID (US); Karl W. Holtzclaw, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/934,659

(22) Filed: Nov. 6, 2015

(65) Prior Publication Data
US 2017/0133383 A1 May 11, 2017

(51) Int. Cl.
*H01L 27/108* (2006.01)
*G11C 11/407* (2006.01)
(Continued)

(52) U.S. Cl.
CPC ...... *H01L 27/10808* (2013.01); *G11C 11/404* (2013.01); *G11C 11/407* (2013.01); *H01L 28/65* (2013.01)

(58) Field of Classification Search
CPC . H01L 27/10808; H01L 28/65; G11C 11/404; G11C 11/407
(Continued)

(56) References Cited

U.S. PATENT DOCUMENTS 5,610,853 A  3/1997  Akiyama et al.
5,619,470 A * 4/1997  Fukumoto ............... G11C 11/22
                                              365/145

(Continued)

FOREIGN PATENT DOCUMENTS

WO    2014124056 A1    8/2014

OTHER PUBLICATIONS

Lee et al., Emergence of Room-Temperature Ferroelectricity at Reduced Dimensions, Science, vol. 349, Isue 6254, pp. 1314-1317.
(Continued)

*Primary Examiner* — Vu Le
*Assistant Examiner* — Sung Cho
(74) *Attorney, Agent, or Firm* — TraskBritt

(57) ABSTRACT

Volatile memory cells including dielectric materials exhibiting a nonlinear capacitance as a function of voltage. The volatile memory cells comprise a source region and a drain region within a substrate and a capacitor coupled to one of the source region and the drain region. The capacitor includes a charge storage material disposed between a pair of electrodes. The charge storage material has a crystal structure comprising an oxide of zirconium, hafnium, and bismuth, and is configured and formulated to transition from a first phase to a second phase exhibiting a higher capacitance than the first phase responsive to application of an electrical field. A digit line is electrically coupled to at least one electrode of the pair of electrodes and one of the source region and the drain region. Semiconductor devices and systems including the volatile memory cells and related methods of operating the volatile memory cells are also described.

30 Claims, 7 Drawing Sheets

(51) Int. Cl.
*G11C 11/404* (2006.01)
*H01L 49/02* (2006.01)

(58) Field of Classification Search
USPC .................. 365/149, 145, 117; 257/303, 296
See application file for complete search history.

(56) References Cited

U.S. PATENT DOCUMENTS

| | | | | |
|---|---|---|---|---|
| 5,889,696 | A * | 3/1999 | Kawakubo | G11C 11/22 365/145 |
| 5,972,722 | A * | 10/1999 | Visokay | H01L 21/31116 257/E21.009 |
| 6,072,207 | A | 6/2000 | Yoshimori et al. | |
| 6,096,597 | A * | 8/2000 | Tsu | H01L 28/40 257/E21.008 |
| 6,111,285 | A * | 8/2000 | Al-Shareef | H01L 27/10852 257/296 |
| 6,140,672 | A * | 10/2000 | Arita | H01L 21/76895 257/295 |
| 6,197,102 | B1 * | 3/2001 | Sawada | C01G 33/006 106/287.18 |
| 6,210,595 | B1 * | 4/2001 | Weinrich | C23F 4/00 216/46 |
| 6,344,991 | B1 * | 2/2002 | Mikami | G11C 11/22 365/117 |
| 6,476,432 | B1 * | 11/2002 | Basceri | H01L 27/10808 257/296 |
| 6,495,878 | B1 * | 12/2002 | Hayashi | H01L 21/31691 257/295 |
| 6,754,108 | B2 * | 6/2004 | Forbes | G11C 11/404 257/E29.129 |
| 6,785,120 | B1 * | 8/2004 | Basceri | H01G 4/1209 257/303 |
| 6,831,313 | B2 | 12/2004 | Uchiyama et al. | |
| 6,940,740 | B2 * | 9/2005 | Ueda | G11C 11/22 257/E21.664 |
| 7,791,149 | B2 | 9/2010 | Boescke | |
| 8,513,773 | B2 * | 8/2013 | Takemura | H01L 21/84 257/300 |
| 8,581,318 | B1 * | 11/2013 | Chen | H01L 28/60 257/296 |
| 8,791,519 | B2 | 7/2014 | Li et al. | |
| 9,053,801 | B2 | 6/2015 | Sandhu et al. | |
| 9,331,212 | B2 * | 5/2016 | Kamon | H01L 29/94 |
| 2001/0012698 | A1 * | 8/2001 | Hayashi | H01L 21/31691 438/782 |
| 2002/0115252 | A1 * | 8/2002 | Haukka | C23C 16/40 438/240 |
| 2003/0064604 | A1 * | 4/2003 | Umeda | H01L 21/31691 438/745 |
| 2006/0273367 | A1 * | 12/2006 | Wang | H01L 27/11502 257/295 |
| 2009/0059646 | A1 * | 3/2009 | Takahashi | G11C 11/22 365/145 |
| 2014/0070157 | A1 | 3/2014 | Sonehara | |

OTHER PUBLICATIONS

Muller et al., Ferroelectricity in Simple Binary ZrO2 and HfO2, Nano Lettters, vol. 12, (2012), pp. 4318-4323.
Reyes-Lillo et al., Antiferreoelectricity in Thin Film ZrO2 From First Principles, PHys. Ref. vol. B90, Sep. 25, 2014, 5 pages.

* cited by examiner

US 9,871,044 B2

1

ENHANCED CHARGE STORAGE MATERIALS, RELATED SEMICONDUCTOR MEMORY CELLS AND SEMICONDUCTOR DEVICES, AND RELATED SYSTEMS AND METHODS

TECHNICAL FIELD

Embodiments disclosed herein relate to memory cells including dielectric materials, paraelectric materials, and ferroelectric materials exhibiting an enhanced dielectric constant. More particularly, embodiments of the disclosure relate to materials configured and formulated to transition between a first phase (e.g., a stable phase or a metastable phase) and a second phase (e.g., a metastable phase) exhibiting a higher dielectric constant than the first phase responsive to application of an electrical field across the material, to related memory cells including the materials and semiconductor devices including such memory cells, and to related systems and methods.

BACKGROUND

An ongoing goal of the semiconductor industry is to reduce a size of individual memory cells of a memory array to occupy less area of a semiconductor substrate (often referred to in the industry as "real estate") per memory cell. A memory cell, such as a dynamic random-access memory (DRAM) cell, typically includes a charge storage capacitor coupled to an access device, such as a field-effect transistor (FET) or a metal-oxide-semiconductor field-effect transistor (MOSFET). The access device applies or removes charge to the capacitor, such as during reading and writing operations. The charges stored on the capacitor are used to determine a logic state of the memory cell. In the ongoing goal to increase a packing density of memory cells of a memory array, a size of the capacitors may be reduced.

Capacitors may include a dielectric material disposed between two electrodes. A storage capacity of a capacitor is, at least in part, a function of properties (e.g., a dielectric constant) of the dielectric material. Capacitors including high-k dielectric materials exhibit a higher capacitance than those of similar size and configuration including a dielectric material having a lower dielectric constant. Conventional high-k dielectric materials include crystalline oxides exhibiting highly symmetric crystal structures (e.g., such as those that exhibit tetragonal or cubic crystal structures).

However, as feature sizes of memory cells are reduced, formation of dielectric materials capable of storing sufficient charges for operation of the memory cell becomes a challenge. For example, below a thickness of about 6 nm, formation of low-defect crystalline materials with a high dielectric permittivity is challenging. In addition, at such low thicknesses, many dielectric materials exhibit leakage currents and tunneling, reducing an amount of charge stored on the capacitor during use and operation. Further, at low thicknesses, the dielectric materials may exhibit polymorphism, leading to competing phases that are difficult to control. In some instance, the low thicknesses promote an amorphous phase. Some high-k dielectric materials include oxygen vacancies that serve as charge traps and increase leakage from the dielectric materials, as well as adversely affect endurance and device reliability.

DETAILED DESCRIPTION

Figure 1:
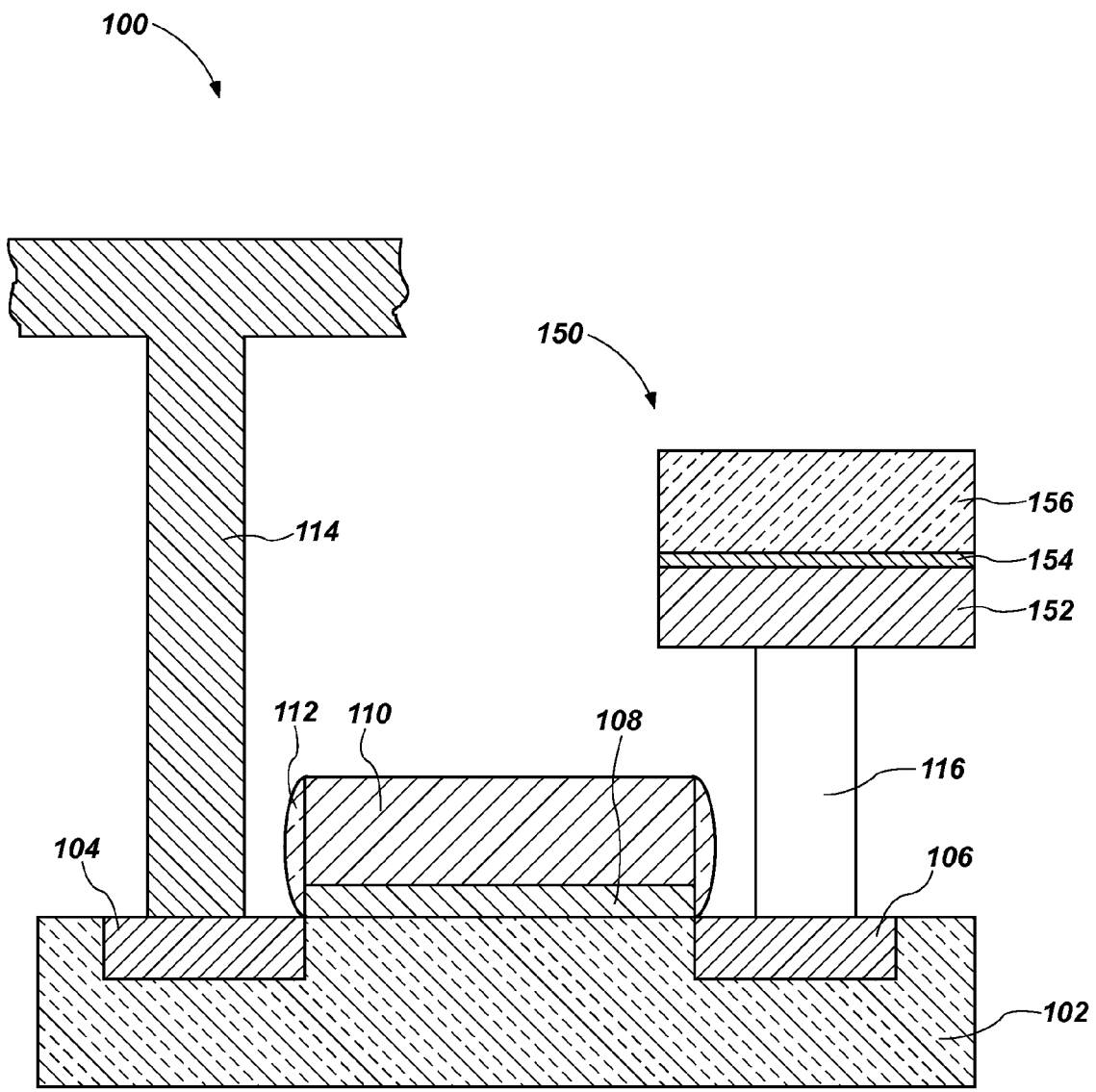
FIG. 1 is a cross-sectional view of a memory cell including a charge storage material, in accordance with an embodiment of the disclosure.

The illustrations included herewith are not meant to be actual views of any particular systems or semiconductor devices, but are merely idealized representations that are employed to describe embodiments herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing memory cells, and the memory cells described below do not form a complete memory cell. Only those process acts and structures necessary to understand the embodiments described herein are described in detail below. Additional acts to form a complete memory cell may be performed by conventional techniques.

As feature sizes of memory cells continue to shrink, capacitors used to store charges associated with a logic state of the memory cell may store higher charges per unit area. Thus, charge storage materials of such capacitors may exhibit higher dielectric constants. As used herein, a "charge storage" material means and includes a material, such as a dielectric material, a paraelectric material, an antiferroelectric material, or a material exhibiting antiferroelectric properties that is capable of holding a charge. The charge may be used to determine a logic state of a memory cell associated with the charge storage material. According to embodiments disclosed herein, charge storage materials exhibiting a nonlinear capacitance (and, hence, a nonlinear dielectric constant) as a function of applied electrical field are described. The charge storage materials are configured and formulated to exhibit an increased dielectric constant within a voltage range encountered during use and operation of a memory cell in which the charge storage materials are disposed. The charge storage materials may be configured and formulated to exhibit a decreased capacitance at voltages equal to about a voltage used to access the memory cell (e.g., $V_{cc}/2$) and exhibit an increased capacitance at voltages equal to about voltages used to charge the memory cell to a charge corresponding to a first logic state or a second logic state (e.g., a 0 logic state or a 1 logic state). Thus, the charge storage materials may enhance capacitance of the memory cell at voltages corresponding to a 0 or a 1 logic state of the memory cell and may exhibit a reduced capacitance at voltages therebetween. As used herein, a logic state of 0 may correspond to a first voltage applied to the charge storage material and a logic state of 1 may correspond to a second voltage applied to the charge storage material. The first voltage may be higher or lower than the second voltage and may have a greater or lesser magnitude than the second voltage.

FIG. 1 illustrates a memory cell 100 including a charge storage material 154 according to an embodiment of the disclosure. The memory cell 100 may be part of a memory array of a semiconductor device including a plurality of memory cells. The memory cell 100 may include a volatile memory cell, such as a dynamic random-access memory (DRAM) cell, a static random-access memory (SRAM) cell, or other volatile memory cell. The memory cell 100 includes a substrate 102, a source region 104, and a drain region 106. The substrate 102 may be a semiconductor substrate, a base semiconductor material on a supporting substrate, a metal electrode, or a semiconductor substrate having one or more materials, structures, or regions formed thereon. The substrate 102 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation.

The source region 104 and the drain region 106 may include a semiconductor material having a different carrier type than the substrate 102. For example, the source region 104 and the drain region 106 may include n-type semiconductor material, whereas the substrate 102 may include a semiconductor material having a different carrier type (e.g., p-type semiconductor material) to form, for example, n channel field effect transistor including a gate dielectric material 108 and a gate electrode 110. In other embodiments, the source region 104 and the drain region 106 may include p-type semiconductor material and the substrate 102 may include n-type semiconductor material to form a p channel field effect transistor.

The gate dielectric material 108 may overlie the substrate 102 between the source region 104 and the drain region 106. The gate dielectric material 108 may include silicon dioxide, or a high-k dielectric material, such as, for example, tantalum oxide ($Ta_2O_5$), zirconium dioxide ($ZrO_2$), hafnium oxide ($HfO_2$), strontium oxide ($Sr_yO_x$, such as, for example, SrO), barium oxide ($Ba_yO_x$, such as, for example, BaO), strontium titanium oxide ($SrTiO_3$, also known as STO), another suitable gate dielectric material, or combinations thereof.

The gate electrode 110 may overlie the gate dielectric material 108. The gate electrode 110 may include a conductive material, such as, for example, titanium, tantalum, tungsten, ruthenium, iridium, platinum, nitrides thereof, polysilicon, or other suitable conductive gate electrode material.

Sidewall spacers 112 may be formed on sidewalls of the gate electrode 110 and the gate dielectric 108. The sidewall spacers 112 may include a silicon oxide (e.g., silicon dioxide), silicon nitride, or other suitable insulating material.

An access line 114 (e.g., a digit line, a bit line, etc.) may be coupled to the source region 104 and configured to apply a voltage to the source region 104. The access line 114 may include a conductive material such as, for example, tungsten, titanium, tantalum, platinum, a silicide thereof, polysilicon, or other suitable conductive material.

A conductive plug 116 may overlie the drain region 106 and may conductively connect the drain region 106 to a capacitor 150 including a bottom electrode 152, a top electrode 156, and the charge storage material 154 disposed between the bottom electrode 152 and the top electrode 156. The conductive plug 116 may be in electrical communication with the bottom electrode 152. The conductive plug 116 may include a conductive material, such as, for example, tungsten, titanium, tantalum, platinum, a silicide thereof, polysilicon, or other suitable conductive material.

The bottom electrode 152 may include a conductive material. In some embodiments, the bottom electrode 152 includes titanium, titanium nitride (TiN), titanium aluminum nitride (TiAlN), tantalum, tantalum nitride (TaN), tungsten, tungsten nitride, ruthenium, iridium, platinum, a silicon-containing electrode (e.g., titanium silicon nitride (TiSiN), tungsten silicide ($WSi_x$), ruthenium silicide ($RuSi_x$)), another conductive material, or a combination thereof. The top electrode 156 may include titanium, titanium nitride (TiN), titanium aluminum nitride (TiAlN), tantalum, tantalum nitride (TaN), tungsten, tungsten nitride, ruthenium, iridium, platinum, a silicon-containing electrode (e.g., titanium silicon nitride (TiSiN), tungsten silicide ($WSi_x$), ruthenium silicide ($RuSi_x$)), another conductive material, or a combination thereof. In some embodiments, the top electrode 156 and the bottom electrode 152 include the same material.

In some embodiments, the charge storage material 154 may include a material exhibiting a nonlinear capacitance as a function of a voltage applied (i.e., an applied electrical field) across the top electrode 156 and the bottom electrode 152, at least within a voltage range encountered during use and operation of the memory cell 100, as described herein. Compared to a memory cell including a conventional dielectric material, the memory cell 100, according to some embodiments, may store an increased charge and may be operated with longer refresh intervals due to the increased capacitance of the charge storage material 154.

The charge storage material 154 may include a material exhibiting antiferroelectric properties or paraelectric properties. In some embodiments, responsive to exposure to an electric field (i.e., an applied voltage), the charge storage material 154 may transition from a material exhibiting dielectric properties to a material exhibiting antiferroelectric-like properties. As used herein, an "antiferroelectric" material or a material exhibiting "antiferroelectric-like" properties means and includes a material that includes an ordered array of electric dipoles wherein adjacent dipoles are oriented in opposite directions. Antiferroelectric materials exhibit hysteresis under an applied external electrical field, but do not exhibit a remnant polarization when the external field is removed therefrom. As used herein, a "paraelectric" material means and includes a material that exhibits a nonlinear polarization responsive to application of an electrical field and that does not exhibit hysteresis characteristics. Removal of the electrical field results in a polarization of the paraelectric material returning to zero. In other words, when an electrical field is removed from a paraelectric material, the paraelectric material does not exhibit a remnant polarization. An amount of polarization of a paraelectric material may be a function of the electrical field applied to the paraelectric material and the material properties of the paraelectric material.

The charge storage material 154 may be configured and formulated to transition between a first phase and a second phase during use and operation of the memory cell 100. The first phase may include a stable phase or a metastable phase and the second phase may include another metastable phase. As described herein, the charge storage material 154 may transition between the first phase and the second phase responsive to exposure to a critical voltage, which may correspond to operating voltages of the memory cell 100. The charge storage material 154 may exhibit an increased capacitance in the second phase compared to a capacitance of the charge storage material 154 in the second phase. The charge storage material 154 may reversibly transition back to the first phase by removing application of the critical voltage. Thus, the charge storage material 154 may be a phase-changing material and a capacitance of the charge storage material 154 may be altered by changing the phase of the charge storage material 154.

Figure 2A:
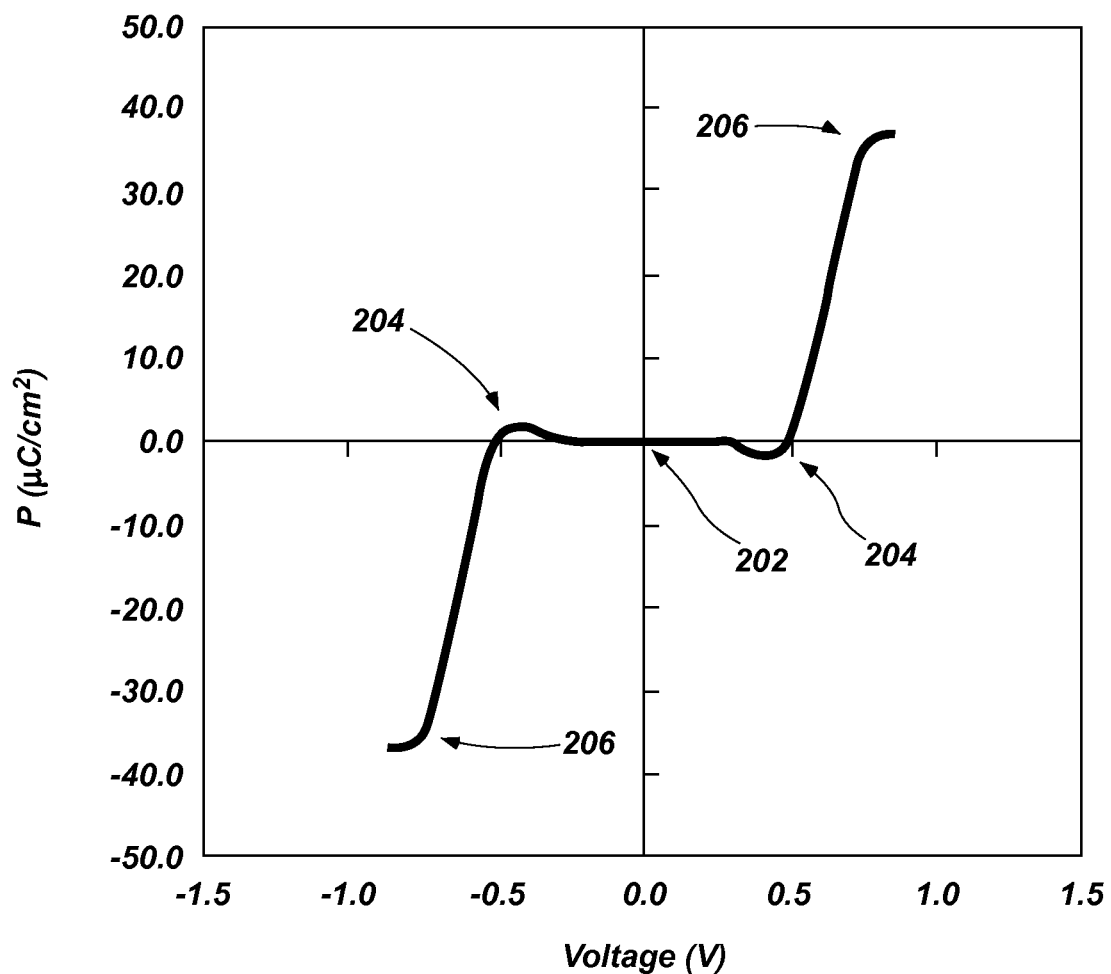
FIG. 2A through FIG. 2C are graphs illustrating a polarization of a charge storage material responsive to application of an electrical field across the charge storage material, in accordance with embodiments of the disclosure.

With reference to FIG. 2A, the charge storage material 154 (FIG. 1) may be configured and formulated to exhibit a change in polarization when exposed to a critical voltage having a predetermined magnitude, as indicated at 204. The charge storage material 154 may exhibit a polarization of approximately zero when no electrical field is applied, as indicated at 202. Further, the charge storage material 154 may exhibit negligible change in polarization when exposed to a voltage having a lower magnitude than the critical voltage. Responsive to exposure to a voltage having a magnitude greater than a magnitude of the critical voltage, the charge storage material 154 may exhibit an increase in polarization, and a corresponding increase in capacitance, as illustrated at 206. A polarization of the charge storage material 154 may be symmetrical with respect to the voltage applied to the charge storage material 154. For example, the charge storage material 154 may exhibit a positive polarization when exposed to a positive critical voltage and may exhibit a negative polarization having the same magnitude as the positive polarization when exposed to a negative critical voltage having the same magnitude as the positive critical voltage. Thus, the charge storage material 154 may be configured and formulated to switch from the stable phase to the metastable phase responsive to exposure to voltage having a greater magnitude than the critical voltage.

Although FIG. 2A illustrates that the critical voltage has a magnitude of about 0.5 V, the critical voltage may have a magnitude of about 0.6 V, about 0.7 V, or about 0.8 V.

Figure 2B:
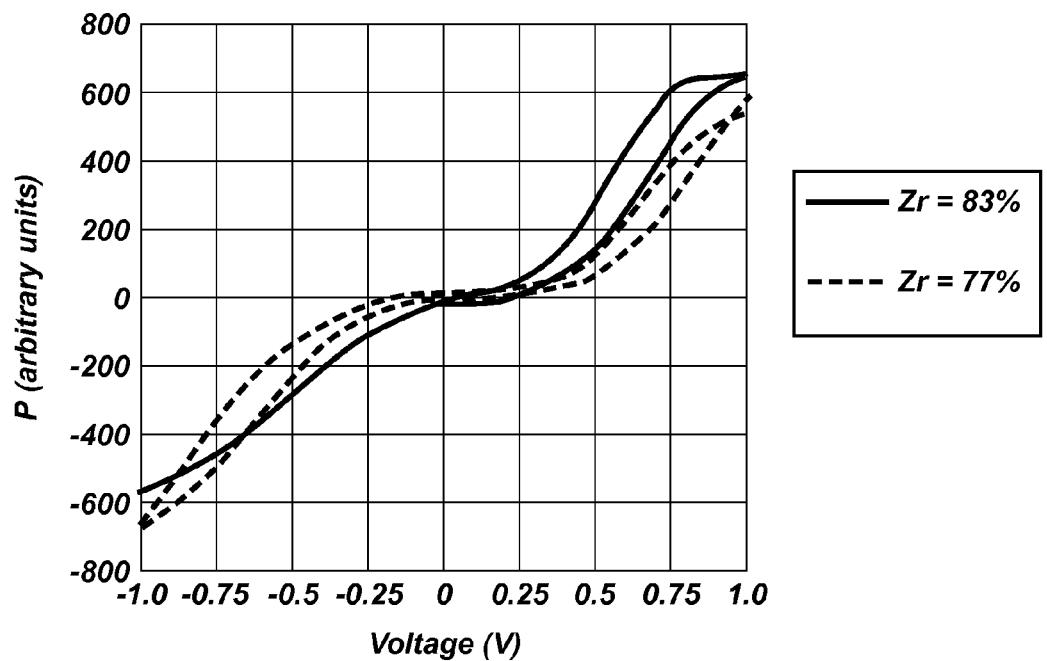

FIG. 2B illustrates a polarization as a function of applied voltage of charge storage materials 154 including different atomic percentages of zirconium and exhibiting antiferroelectric properties. When exposed to voltages above a magnitude of about, for example 0.5 V, a charge storage material 154 including about 77 atomic percent zirconium may exhibit antiferroelectric properties. The charge storage material 154 may exhibit hysteresis when exposed to voltages above a magnitude of about 0.5 V, and may exhibit a negligible polarization when exposed to voltages having a magnitude less than about 0.5 V. Further, at a zero bias, the charge storage material 154 does not exhibit a remnant polarization. Another charge storage material 154 may comprise about 83 atomic percent zirconium, may exhibit antiferroelectric properties, and may exhibit hysteresis when exposed to voltages having a magnitude larger than about 0.4 V. At voltages having a magnitude less than about 0.4 V, the charge storage material 154 may exhibit a negligible polarization. The charge storage material 154 may not exhibit a remnant polarization when exposed to a zero bias.

Figure 2C:
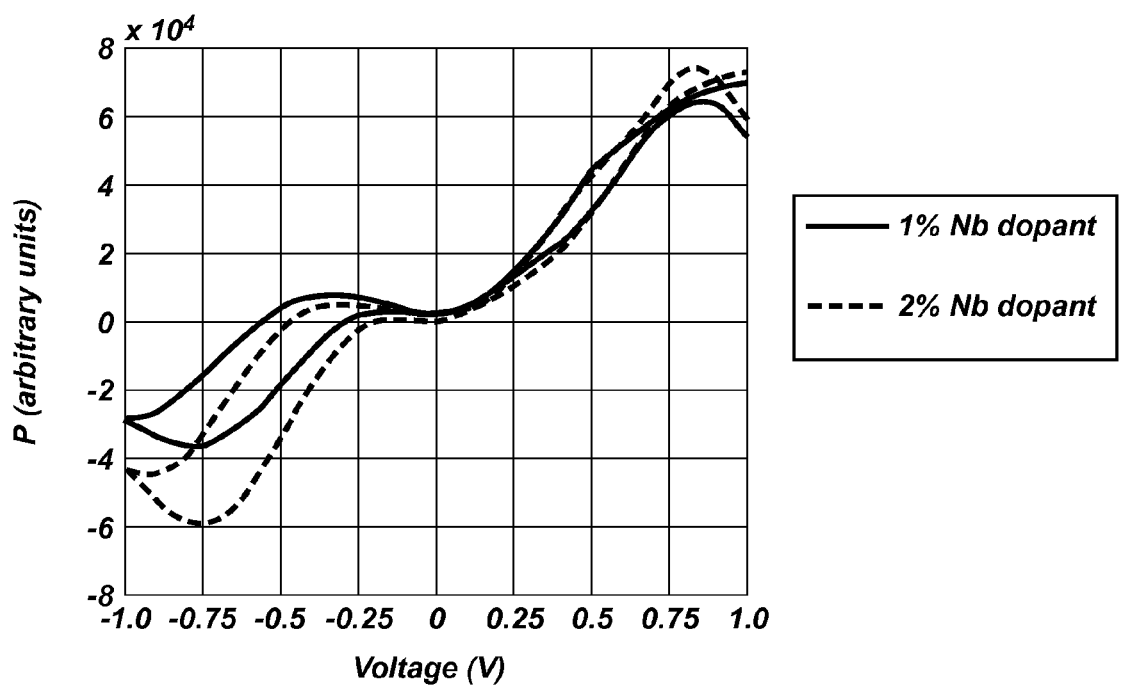

In some embodiments, the charge storage material 154 may be configured and formulated to exhibit hysteresis responsive to exposure to one of a positive voltage and a negative voltage, while not exhibiting hysteresis responsive to exposure to another of the positive voltage and the negative voltage. In other words, the charge storage material 154 may exhibit hysteresis depending on a direction of an applied electrical field. In some embodiments, such a charge storage material 154 may be doped with one or more dopants. For example, referring to FIG. 2C a polarization of a charge storage material 154 doped with about 1 atomic percent niobium and another charge storage material 154 doped with about 2 atomic percent niobium as a function of applied voltage is illustrated. The charge storage materials 154 may exhibit hysteresis when exposed to a negative voltage having a magnitude larger than about, for example, 0.25 V and may not exhibit hysteresis when exposed to other voltages (e.g., such as positive voltages having a magnitude greater than, for example, 0.25 V). The charge storage materials 154 may not exhibit a remnant polarization at a zero bias voltage.

As described above, the charge storage material 154 may be configured and formulated to exhibit a nonlinear capacitance as a function of voltage within a particular voltage range. In some embodiments, the charge storage material 154 may be configured and formulated to exhibit a nonlinear dielectric constant when exposed to a voltage within a range of voltages conventionally utilized during use and operation of a DRAM memory cell, such as between about 0.5 V and about 0.5 V, between about −0.6 V and about 0.6 V, between about −0.7 V and about 0.7 V, or between about −0.8 V and about 0.8 V. With reference again to FIG. 2A, the charge storage material 154 may not exhibit significant polarization until the applied electrical field exceeds the critical voltage.

A capacitance of the charge storage material 154 may change with changing temperature. In some embodiments, the charge storage material 154 is configured and formulated to exhibit an increased capacitance at operating temperatures of the memory cell 100 (FIG. 1) in which the charge storage material 154 is disposed. For example, the charge storage material 154 may be configured and formulated to exhibit an increased capacitance at temperatures between about −40° C. and about 110° C. In some embodiments, the charge storage material 154 may transition between the first phase and the second phase responsive to a change in temperature. In other words, the charge storage material 154 may exhibit the first phase at a first temperature and may exhibit the second phase at one or more temperatures that are different from the first temperature.

Figure 3A:
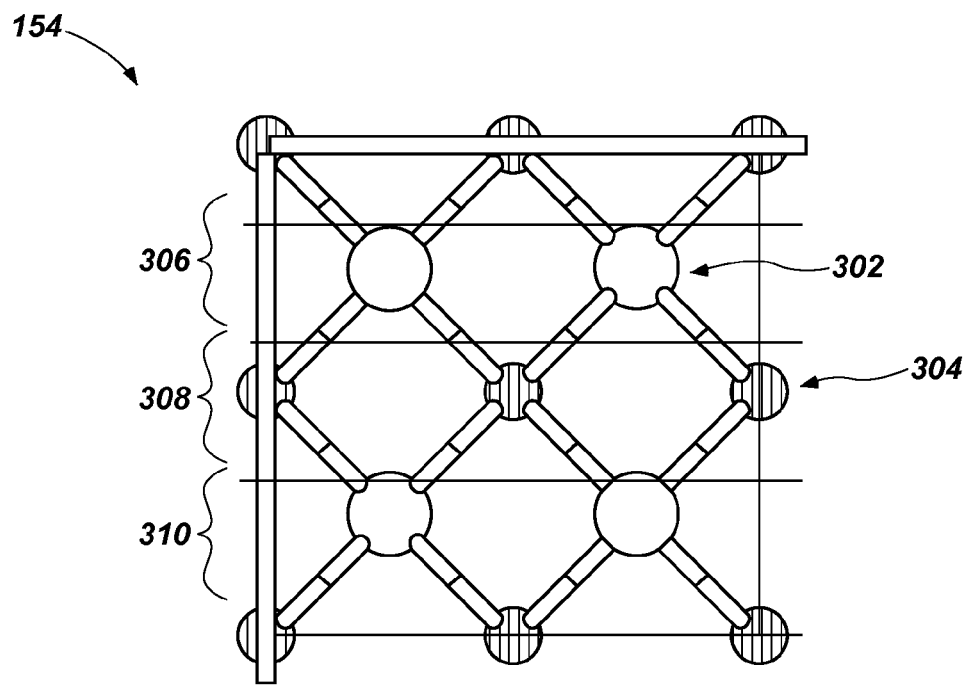
FIG. 3A and FIG. 3B are schematic representations of crystal structures of a charge storage material in a first phase and a second phase, respectively, in accordance with an embodiment of the disclosure.

In some embodiments, the charge storage material 154 may be crystalline. As used herein, a material including a "crystal structure" or a "crystalline material" means and includes materials having a cubic, tetragonal, orthorhombic, hexagonal, rhombohedral, monoclinic, or triclinic crystal structure, and may also include polycrystalline materials or nanocrystalline materials. The terms "crystal structure" and "crystalline material" may be used interchangeably herein. FIG. 3A illustrates an embodiment of a charge storage material 154 having a first phase comprising a tetragonal crystal structure. The crystal structure may include an ionic lattice defined by cationic lattice sites 302 and anionic lattice sites 304. As will be described herein, the anionic lattice sites 304 may comprise oxygen and the cationic lattice sites 302 may comprise zirconium, hafnium, bismuth, antimony, arsenic, titanium, niobium, aluminum, tantalum, strontium, lanthanum, silicon, and combinations thereof.

The crystal structure may include alternating layers of the cationic lattice sites 302 (e.g., layers 306, 310) and layers of the anionic lattice sites 304 (e.g., layer 308). Cationic lattice sites 302 within the same layer (e.g., layer 304) may include the same cationic atoms. By way of example, the cationic lattice sites 302 within the first layer 306 may comprise zirconium, while the cationic lattice sites 302 in another layer (e.g., 310) may comprise hafnium atoms or atoms of at least one other element, such as, for example, bismuth, antimony, arsenic, titanium, niobium, aluminum, tantalum, strontium, or silicon.

Figure 3B:
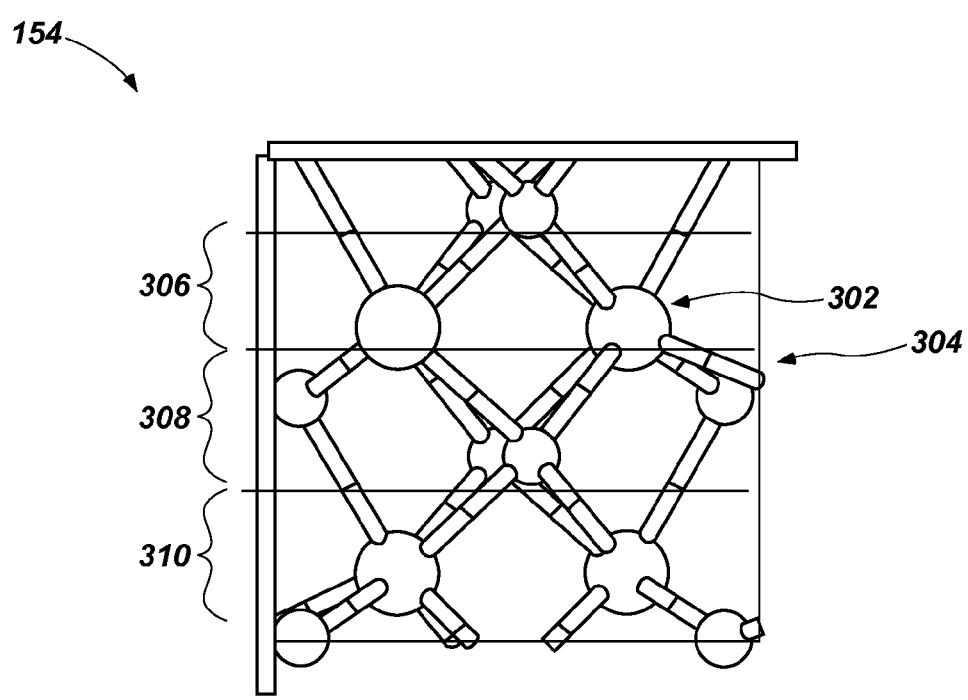

FIG. 3B illustrates the charge storage material 154 when the charge storage material 154 has transitioned to second phase, comprising a metastable phase. By way of nonlimiting example, in the metastable phase, the charge storage material 154 may exhibit an orthorhombic crystal structure. Relative positions of the cationic lattice sites 302 to the anionic lattice sites 304 may be different in the first phase and in the second phase.

Although FIG. 3A and FIG. 3B illustrate the first phase and the second phase as being a tetragonal and an orthorhombic crystal structure, respectively, the disclosure is not so limited. For example, the second phase may exhibit any crystal structure as long as the second phase exhibits an increased capacitance and an increased dielectric constant relative to the first phase and the charge storage material 154 is caused to transition from the first phase to the second phase by application of an electrical field. For example, the charge storage material 154 may include any material exhibiting two physical states that are energetically similar, one of which is a metastable phase, and the other of which is a phase at least slightly more stable than the metastable phase (i.e., a stable phase or another metastable phase), wherein the charge storage material 154 may reversibly transition between the first phase and the second phase responsive to exposure to a positive or a negative bias voltage exceeding a magnitude of a critical voltage. While not wishing to be bound by any particular theory, it is believed that, at least in some embodiments, the charge storage material 154 includes polar nanoregions in which the charge storage material 154 exhibits localized polarization caused by the displacement of atoms within the crystal structure caused by local dipole moments. The polar nanoregions may be formed by increasing, for example, a number of oxygen vacancies within the crystal structure or by forming the charge storage material 154 to include a deficiency of one or more atoms that comprise the anionic latter sites 304 or cationic lattice sites 302.

In some embodiments, the charge storage material 154 may include an oxide having the general formula $(Zr_xHf_{(1-x-y)}A_yO_z)$, wherein element A is one of bismuth, antimony, arsenic, tantalum, strontium, niobium, titanium, aluminum, and lanthanum, x is between about 0.6 and about 1, such as between about 0.65 and about 0.95, between about 0.70 and about 0.90, or between about 0.75 and about 0.85, and y is between about 0.01 and about 0.20, such as between about 0.02 and about 0.18, between about 0.05 and about 0.15, or between about 0.08 and about 0.12. In some embodiments, z is between about 1 and about 3, such as between about 1 and about 2, or between about 2 and about 3. In some embodiments, z is equal to about 2. Zirconium, hafnium, and element A may occupy the cationic lattice sites 302 (FIG. 3A) of the crystal structure and the oxygen may occupy the anionic lattice sites 304 (FIG. 3A) of the crystal structure. In other embodiments, the charge storage material 154 includes hafnium silicate ($HfSiO_4$). In yet other embodiments, the charge storage material 154 has the formula $Al_wZr_xHf_{(1-w-x-y)}A_yO_z$, or $Al_wZr_xHf_{(1-w-x-y)}Nb_vA_yO_z$, wherein w and v are between about 0.01 and about 0.99, such as between about 0.01 and about 0.1, between about 0.1 and about 0.25, between about 0.25 and about 0.5, between about 0.5 and about 0.75, or between about 0.75 and about 0.99.

In some embodiments, element A may constitute about 10 atomic percent of the charge storage material 154. Nonlimiting examples of the charge storage material 154 include zirconium oxide ($ZrO_2$), zirconium hafnium oxide ($ZrHfO_2$), titanium zirconium hafnium oxide ($TiZrHfO_2$), niobium zirconium hafnium oxide ($NbZrHfO_2$), aluminum zirconium hafnium oxide ($AlZrHfO_2$), tantalum zirconium hafnium oxide ($TaZrHfO_2$), bismuth zirconium hafnium oxide ($BiZrHfO_2$), strontium zirconium hafnium oxide ($SrZrHfO_2$), or bismuth aluminum zirconium hafnium oxide ($BiAlZrHfO_x$). In some embodiments, the charge storage material 154 comprises bismuth zirconium hafnium oxide.

In some embodiments, the charge storage material 154 includes more zirconium atoms than hafnium atoms. The electrical properties described above with reference to FIG. 2A through FIG. 2C (e.g., the critical voltage), may be tailored by selecting a ratio of zirconium atoms to hafnium atoms in the charge storage material 154. By way of nonlimiting example, the charge storage material 154 may include at least about 3 zirconium atoms for every hafnium atom, at least about 4 zirconium atoms for every hafnium atom, or at least about 5 zirconium atoms for every hafnium atom. In some embodiments, increasing a ratio of zirconium atoms to hafnium atoms in the charge storage material 154 may reduce the critical voltage.

The charge storage material 154 may also include at least one dopant, which may be selected to tailor the dielectric constant of the charge storage material 154. In some embodiments, the at least one dopant is dispersed within the crystal structure of the charge storage material 154 (i.e., the at least one dopant does not occupy any lattice sites). The dopant may include zirconium ($Zr^{4+}$), tantalum ($Ta^{3+}$, $Ta^{4+}$, $Ta^{5+}$), strontium ($Sr^{2+}$), niobium ($Nb^{3+}$, $Nb^{4+}$, $Nb^{5+}$), magnesium ($Mg^{2+}$), lanthanum ($La^{3+}$), gadolinium ($Gd^{3+}$), calcium ($Ca^{2+}$), bismuth ($Bi^{3+}$, $Bi^{5+}$), barium ($Ba^{2+}$), titanium ($Ti^{2+}$, $Ti^{3+}$, $Ti^{4+}$), hafnium ($Hf^{4+}$), aluminum ($Al^{3+}$), silicon, or combinations thereof. In some embodiments, the at least one dopant may include the same element as contained within the crystal structure of the charge storage material 154. By way of nonlimiting example, the charge storage material 154 may include a crystal structure having cationic lattice sites 302 (FIG. 3A) comprising bismuth, and may further include a bismuth dopant.

In some embodiments, the charge storage material 154 may include at least two dopants. By way of nonlimiting example, the charge storage material 154 may be doped with bismuth and aluminum. The dopants and dopant concentration may be selected such that the charge storage material 154 exhibits a nonlinear capacitance as a function of applied voltage within a particular voltage range. In some embodiments, the charge storage material 154 includes bismuth zirconium hafnium oxide doped with niobium and aluminum.

A concentration of the dopants may be from about 0 atomic percent up to about 20 atomic percent of the charge storage material 154, such as between about 2 atomic percent and about 18 atomic percent, between about 5 atomic percent and about 15 atomic percent, or between about 8 atomic percent and about 12 atomic percent of the charge storage material 154.

In other embodiments, the charge storage material 154 comprises hafnium silicate ($HfSiO_4$). In some embodiments, silicon may constitute between about 5 atomic percent and about 16 atomic percent of the charge storage material 154, such as between about 7 atomic percent and about 14 atomic percent, or between about 9 atomic percent and about 12 atomic percent of the charge storage material 154. The hafnium silicon oxide may be formed with a high temperature anneal (e.g., between about 500° C. and about 1000° C., such as between about 500° C. and about 750° C., or between about 750° C. and about 1000° C.) to form a crystal structure exhibiting a first phase and a second phase having a higher capacitance than the first phase.

In yet other embodiments, the charge storage material 154 may include hafnium oxide doped with one or more rare earth elements. In some embodiments, the charge storage material 154 is doped with one or more of lanthanum, scandium, gadolinium, erbium, samarium, yttrium, and terbium. The rare earth elements may constitute between about 1 atomic percent and about 10 atomic percent of the charge storage material 154.

The charge storage material 154 may have a thickness between about 5 nm and about 10 nm, such as between about 6 nm and about 9 nm, or between about 7 nm and about 8 nm. In some embodiments, the charge storage material 154 has a thickness of about 6 nm.

The charge storage material 154 may be formed by atomic layer deposition (ALD), chemical vapor deposition (CVD), or another method of forming a material having a desired thickness of the charge storage material 154. In some embodiments, the charge storage material 154 is formed by ALD. With reference again to FIG. 3A and FIG. 3B, each layer (e.g., layers 306, 308, 310) of the charge storage material 154 may be formed by exposing, for example, the bottom electrode 152 (FIG. 1) to a precursor formulated to deposit the material of the layer being deposited. Thus, the layers including the cationic lattice sites 302 may be formed by exposing the bottom electrode 152 to ALD precursors of the cationic ions (e.g., zirconium, hafnium, or element A, described above). After each layer comprising the cationic ions is formed, the charge storage material 154 may be oxidized, such as by exposing the charge storage material 154 to an oxidizing agent (e.g., oxygen, ozone, etc.).

Thus, the charge storage material 154 may include cationic lattice sites 302 comprising zirconium, hafnium, and one or more of bismuth, antimony, arsenic, tantalum, strontium, niobium, titanium, aluminum, lanthanum, and silicon. The cationic layers proximate the bottom electrode 152 may comprise any of zirconium, hafnium, or the at least another element (e.g., bismuth, antimony, arsenic, tantalum, strontium, niobium, titanium, aluminum, lanthanum, and silicon). In some embodiments, the charge storage material 154 comprises alternating layers including cationic lattice sites 302 adjacent to layers comprising anionic lattice sites 304. The layers comprising cationic lattice sites 302 may each individually include one of zirconium atoms, hafnium atoms, or atoms of the at least another element. In some embodiments, cationic layers proximate an interface between the charge storage material 154 and the bottom electrode 152, an interface between the charge storage material 154 and the top electrode 156, or both may include the at least another element.

Accordingly, a volatile memory cell comprises a source region and a drain region within a substrate, a capacitor coupled to one of the source region and the drain region, the capacitor including a charge storage material disposed between a pair of electrodes and having a crystal structure comprising an oxide of zirconium, hafnium, and bismuth, the charge storage material configured and formulated to transition from a first phase to a second phase exhibiting a higher capacitance than the first phase responsive to application of an electrical field, and a digit line electrically coupled to at least one electrode of the pair of electrodes and one of the source region and the drain region.

Accordingly, a volatile memory cell comprises a source region and a drain region within a substrate, a capacitor coupled to one of the source region and the drain region, the capacitor including a charge storage material disposed between a pair of electrodes and having a crystal structure configured and formulated to transition from a first phase to a second phase exhibiting a higher capacitance than the first phase responsive to application of an electrical field, and a digit line electrically coupled to at least one electrode of the pair of electrodes and one of the source region and the drain region.

Figure 4A:
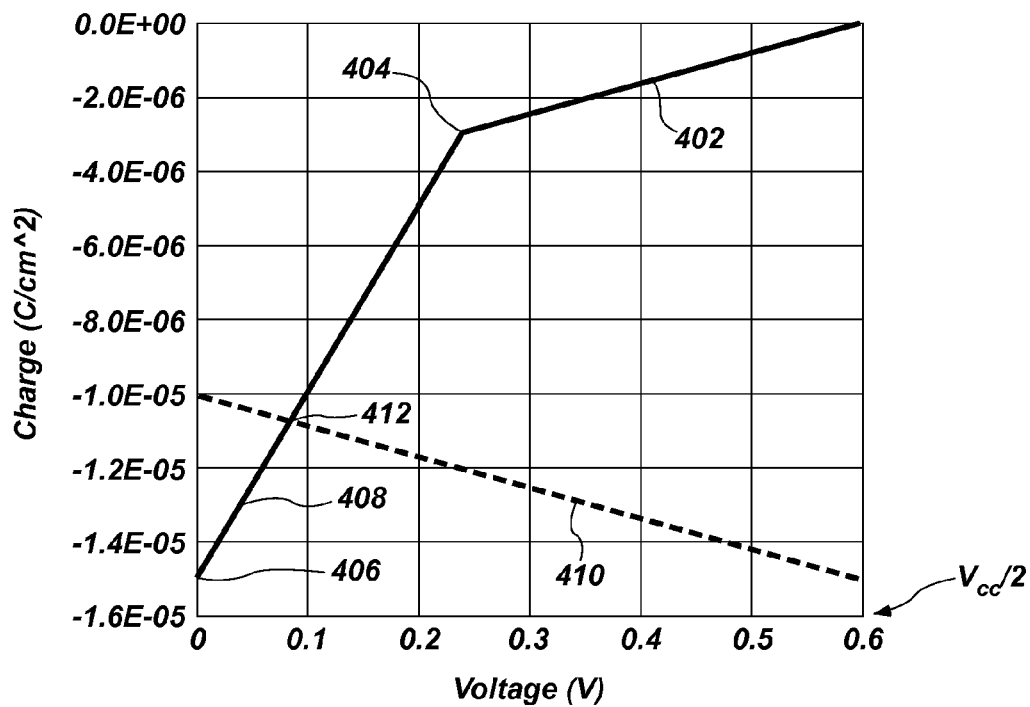
FIG. 4A and FIG. 4B are graphs illustrating electrical properties of a memory cell including a charge storage material, in accordance with an embodiment of the disclosure.

FIG. 4A is a graph illustrating electrical properties of a memory cell including a capacitor comprising the charge storage material 154 (FIG. 1). The memory cell may be part of a memory array of a semiconductor device. Line 402 represents a charge on the memory cell associated with the charge storage material 154 as a function of a voltage applied to the charge storage material 154. A slope of line 402 represents a capacitance of the charge storage material 154 (since capacitance is equal to a charge divided by voltage, i.e., C=Q/V). Thus, the charge storage material 154 exhibits a different capacitance over the voltage range plotted in FIG. 4A. For example, when the charge storage material 154 is exposed to a critical voltage of about 0.24 V, the charge storage material 154 exhibits a change in capacitance, as indicated at 404. Below the critical voltage, the charge storage material 154 exhibits an increased capacitance, and above the critical voltage the charge storage material 154 exhibits a decreased capacitance. The increased capacitance (i.e., the steeper slope of line 402 at voltages below about 0.24 V) may correspond to a metastable phase of the charge storage material 154, while the decreased capacitance (at voltages between about 0.24 V and $V_{cc}/2$) may correspond to a stable phase of the charge storage material 154.

During use and operation, the memory cell may be accessed through an access line (e.g., access line 114 (FIG. 1)), which may be biased to a voltage of $V_{cc}/2$, referred to herein as an access voltage. Prior to accessing the memory cell, the memory cell may be charged to a charge corresponding to the logic state of the memory cell (e.g., to a charge of about −1.5 µC/cm², indicated at 406 for a first logic state). The charge stored on the memory cell may be equal to a product of a potential between electrodes of the memory cell and the capacitance of the capacitor, or $-V_{cc}/2 * C_{cell}$, where $C_{cell}$ is the capacitance of the memory cell, as known in the art.

When the memory cell is accessed, a charge on the memory cell is shared with the access line used to access the memory cell. With continued reference to FIG. 4A, a logic state of the memory cell may be determined during a sensing operation. As a result of charge sharing between the access line and the selected memory cell, the charge on the memory cell is partially discharged in a voltage range where the charge storage material 154 exhibits the increased capacitance, as indicated at 408. In other words, upon the initiation of charge sharing, the charge is shared at voltages where the charge storage material 154 exhibits the increased capacitance. A logic state of the memory cell may be sensed by sensing a bias voltage on the access line when the access line and the memory cell are in communication. Graphically, the bias voltage on the access line during a sensing operation corresponds to a voltage where the access line (indicated as 410) intersects line 402, as indicated at 412. This voltage may be referred to as a sense voltage. The sense margin of the memory cell may be equivalent to a potential difference between a voltage of the access line prior to accessing the memory cell (i.e., the access voltage, $V_{cc}/2$) and the sense voltage on the access line after the cell is accessed. In FIG. 4A, the sense margin is equal to about 0.52 V (i.e., 0.6 V−0.08 V).

Figure 4B:
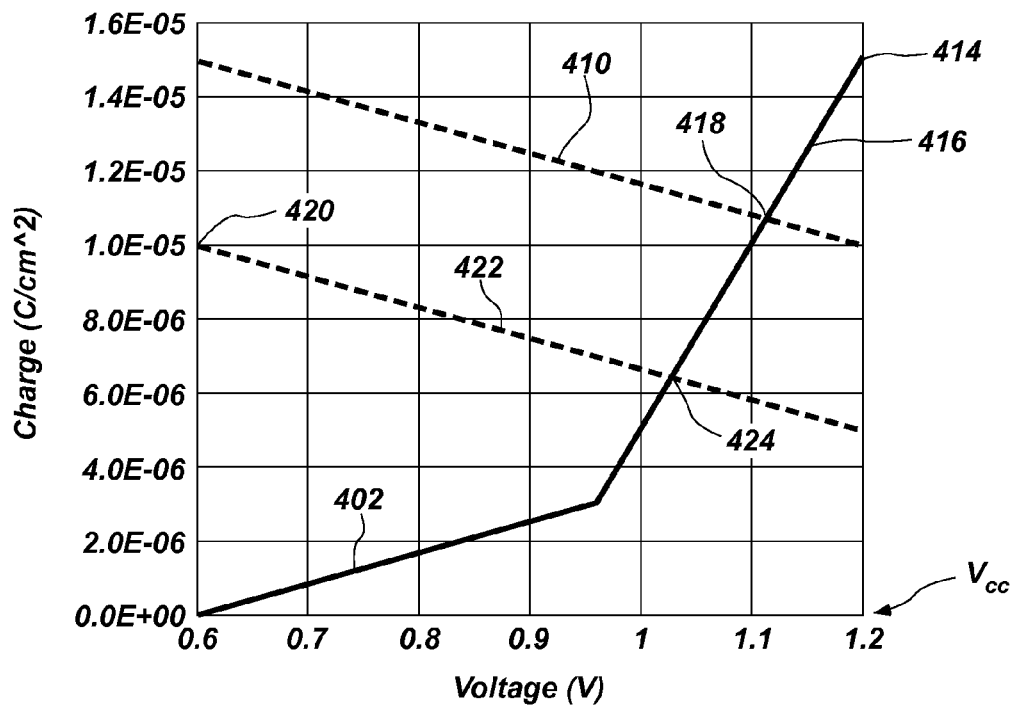

Referring to FIG. 4B, electrical properties of the memory cell including the charge storage material 154 are shown during reading of a memory cell storing a charge corresponding to another logic state, as indicated at 414. To charge the memory cell, the memory cell may be exposed to a bias voltage equal to about $V_{cc}$, which is about 1.2 V for the embodiment of the memory cell described with reference to FIG. 4B. When the memory cell is accessed, such as during a read operation, at least some of the charge on the memory cell is shared with the access line, as indicated at 416. After the charge has been shared, the sense voltage on the access line, indicated at 418, may be about 1.12 V. Thus, the sense margin may be equal to about 0.52 V (i.e., 1.12 V−0.6 V). The increased capacitance of the charge storage material 154 at voltage equal to about the charge voltage (i.e., $V_{cc}$) may increase the sense margin of the memory cell.

With reference to FIG. 4A and FIG. 4B, the charge storage material 154 may exhibit a decreased capacitance at voltages equal to about the access voltage ($V_{cc}/2$) (e.g., about 0.6 V in FIG. 4A and FIG. 4B), and an increased capacitance at voltages equal to about the charge voltages (e.g., 0 V and $V_{cc}$, for the embodiment of the memory cell described with reference to FIG. 4A and FIG. 4B). As one of ordinary skill in the art will appreciate, the increased capacitance at voltages equal to about the charge voltages increases the sense margin of the memory cell. For example, as the memory cell shares its charge during a read operation, for a given amount of charge that is shared, the voltage on the capacitor drops only slightly because of the increased capacitance of the charge storage material 154 at voltages near the charge voltages. Thus, the sense voltage changes only slightly with a change in charge and is at a voltage closer to the charge voltages than in a conventional memory cell. Graphically, because of the increased capacitance of the charge storage material 154 at voltages equal to about the charge voltages, the access line intersects line 402 at a voltage closer to the charge voltage than in a conventional memory cell. Thus, the sooner the memory cell becomes polarizable and exhibits the increased capacitance upon charge sharing, the higher the sense margin of the memory cell. By comparison, a memory cell including a dielectric material exhibiting a linear capacitance may not exhibit a sense margin as large as the sense margin of the memory cell including the charge storage material 154.

With combined reference to FIG. 4A and FIG. 4B, the charge storage material 154 may exhibit a decreased capacitance at voltages equal to about the access voltage ($V_{cc}/2$), which may correspond to a first phase of the charge storage material 154. In some embodiments, the charge storage material 154 may exhibit the decreased capacitance between, for example, about 0.24 V and about 0.96 V. Advantageously, the charge storage material 154 exhibits an increased capacitance at voltages close to about 0 V (e.g., between about 0 V and about 0.24 V for the embodiment of the memory cell described with reference to FIG. 4A and FIG. 4B) and $V_{cc}$ (e.g., between about 0.96 V and a voltage of about $V_{cc}$ (about 1.2 V) for the embodiment of the memory cell described with reference to FIG. 4A and FIG. 4B), which may correspond to a second phase of the charge storage material 154. Because of the voltages at which the charge storage material 154 exhibits the increased capacitance, the charge sharing occur at the increased capacitance, and may result in an increase in the sense margin of the memory cell.

Although FIG. 4A and FIG. 4B illustrate an increased capacitance at voltages around about 0 V and about 1.2 V, the disclosure is not so limited. For example, the charge storage material 154 may be configured and formulated to transition from a first phase to a second phase exhibiting a higher capacitance than the first phase at other voltages than those illustrated in FIG. 4A and FIG. 4B. Thus, a first logic state of the memory cell and a second logic state of the memory cell may correspond to charges that correspond to voltages other than about 0 V and about 1.2 V.

Volatile memory cells, such as DRAM cells, may lose charge over time caused by, for example, leakage currents. By way of nonlimiting example, capacitors including dielectric materials having thicknesses approaching, for example, about 5 nm, may exhibit increased leakage currents. As will be understood by one of ordinary skill in the art, as charge leaks from the memory cell, the sense voltage may decrease because a lower charge is shared with the access line when the memory cell is accessed. However, because the memory cells including the charge storage material 154 exhibiting the increased capacitance as described herein store a higher initial charge than a memory cell that does not exhibit the increased capacitance, the memory cells may exhibit an improved sense margin even after losing some charge. For example, with reference again to FIG. 4B, prior to being accessed, a charge on the memory cell may leak, as indicated at 420, resulting in, for example, a charge of about 10 $\mu C/cm^2$ on the memory cell. Even after losing 5 $\mu C/cm^2$ of charge, the memory cell may exhibit a sense voltage of about 1.03 V, indicated at 424, where access line 422 intersects line 402. Thus, the sense margin may be equal to about 0.43 V. In other words, although the memory cell has lost about one-third of its initial charge, the sense margin may decrease from 0.52 V to about 0.43 V and may not exhibit as substantial a change as the charge loss. By way of comparison, a conventional memory cell including a dielectric material that does not exhibit an increased capacitance at voltages equal to about a charge voltage of the memory cell may exhibit a substantial loss in sense margin after charge loss. Further, the memory cell including the charge storage material 154 may be operated with longer refresh intervals because of the increased capacitance and increased charge stored on the memory cell during use and operation. In other words, even though a memory cell may lose some charges due to leakage currents, a memory cell including the charge storage material 154 may retain a substantial sense margin and therefore, the memory cell may not be refreshed as often as a conventional memory cell without the charge storage material 154.

Figure 5A:
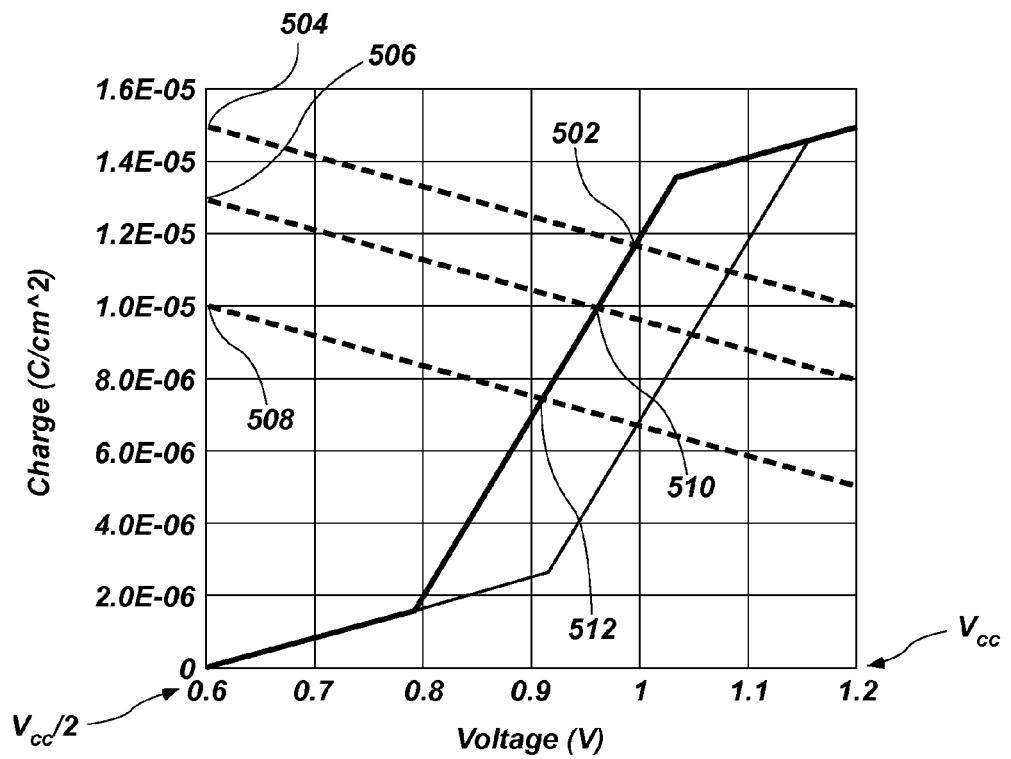
FIG. 5A is a graph illustrating electrical properties of another memory cell including a charge storage material exhibiting antiferroelectric properties, in accordance with an embodiment of the disclosure.

Although FIG. 4A and FIG. 4B illustrate a charge storage material 154 exhibiting paraelectric properties, it is contemplated that the charge storage material 154 may exhibit antiferroelectric properties. With reference to FIG. 5A, electrical properties of a memory cell exhibiting antiferroelectric properties are shown, such as when the memory cell has been charged to a charge corresponding to a first logic state (e.g., at a bias voltage of $V_{cc}$). In the embodiment of FIG. 5A, the memory cell may be charged to an initial charge of about 15 $\mu C/cm^2$, as indicated at 504. The parallel dashed lines in FIG. 5A graphically represent an access line used to access the memory cell when the memory cell has not lost any change prior to being accessed (the top dashed line), when the memory cell has a lost a charge of about 2 $\mu C/cm^2$ prior to being accessed (the middle dashed line), and when the memory has lost a charge of about 5 $\mu C/cm^2$ prior to being accessed (the bottom dashed line). When the memory cell is accessed, the charge on the memory cell is shared with the access line, changing a voltage on the access line. A logic state of the memory cell may be sensed by sensing the bias on the access line when the memory cell has been accessed. Graphically, the sense voltage on the access line when the memory cell has not lost any change prior to being accessed, indicated at 502, is equal to about 1.0 V, which corresponds to a sense margin of about 0.4 V (e.g., 1.0 V–0.6 V). A memory cell including the charge storage material 154 exhibiting an increased capacitance at voltages of about, for example, 0 V or $V_{cc}$ may exhibit an improved sense margin compared to a conventional memory cell including a dielectric material without an increased capacitance.

With continued reference to FIG. 5A, the memory cell may exhibit some charge loss prior to being accessed. For example, the memory cell may exhibit a charge loss of about 2 $\mu C/cm^2$, as indicated at 506, or may exhibit a charge loss about 5 $\mu C/cm^2$, as indicated at 508. A sense voltage of the memory cell accessed after losing a charge of about 2 $\mu C/cm^2$ may be equal to about 0.96 V, as indicated at 510, and the sense margin may be equal to about 0.36 V). A sense voltage of the memory cell accessed after losing a charge of about 5 $\mu C/cm^2$ may be equal to about 0.92 V and the sense margin may be equal to about 0.32 V.

Figure 5B:
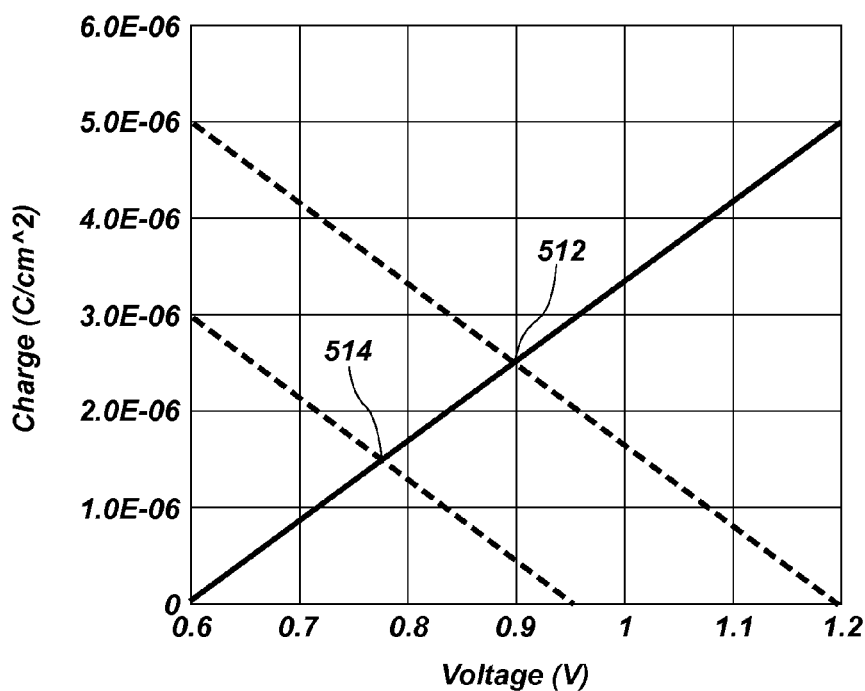
FIG. 5B is a graph illustrating electrical properties of a conventional memory cell including a conventional dielectric material.

Even though the memory cell exhibits some charge loss prior to being accessed, the memory cell including the charge storage material 156 may exhibit an increased sense margin compared to a conventional memory cell without the charge storage material 156. For example, electrical properties of a conventional memory cell including a conventional dielectric material are illustrated in FIG. 5B. The parallel dashed lines in FIG. 5B graphically represent an access line used to access the conventional memory cell when the memory cell has not lost any charge (the top dashed line) and when the memory cell has lost a charge of about 2 $\mu C/cm^2$ (the bottom dashed line) prior to being accessed. Without any charge loss, a sense voltage of the conventional memory cell may be equal to about 0.9 V and the sense margin may be equal to about 0.3 V, as indicated at 512. After exhibiting the same amount of charge loss as the memory cell described above with reference to FIG. 5A, the conventional memory cell may exhibit a substantially lower sense margin. For example, after a charge loss of about 2 $\mu C/cm^2$, the conventional memory cell may exhibit a sense voltage of about 0.78 V and the sense margin may be equal to about 0.18 V, as indicated at 514. If the conventional memory cell loses a charge of about 5 $\mu C/cm^2$ prior to being accessed, the memory cell may exhibit no sense margin (i.e., the sense voltage would be equal to $V_{cc}/2$, or 0.6 V in the embodiment illustrated in FIG. 5B). Accordingly, with reference to FIG. 5A and FIG. 5B, a memory cell including the charge storage material 154 may exhibit an improved sense margin compared to a conventional memory cell including a conventional dielectric material, even when the memory cell including the charge storage material 154 exhibits significant charge loss prior to being accessed.

Accordingly, a semiconductor device comprises a memory array including volatile memory cells, at least one volatile memory cell of the volatile memory cells comprising a gate electrode adjacent to a source region and a drain region within a substrate, and a capacitor coupled to one of the source region and the drain region, the capacitor configured to store a charge corresponding to a logic state of the memory cell. The capacitor comprises a top electrode, a bottom electrode, and a charge storage material configured and formulated to transition from a first phase to a second phase between logic states of the memory cell, the second phase exhibiting a higher capacitance than the first phase.

In use and operation, a semiconductor device including memory cells comprising embodiments of the charge storage materials described herein may consume less power than a semiconductor device including memory cells comprising conventional dielectric materials. For example, during use and operation, a semiconductor device including memory cells each comprising a capacitor with a charge storage material having a higher capacitance at voltages equal to about voltages used to charge the memory cell may exhibit an improved sense margin, even when relatively low charging voltages (e.g., having a magnitude below about 0.5 V, below about 0.6 V, below about 0.7 V, or below about 0.8 V) are used to charge the memory cell. The charge material may transition from a first phase to a second phase during charging of the memory cell. The second phase may exhibit a higher capacitance than the first phase. When the memory cell is accessed, the sense margin of the memory cell may be improved due to the charge storage material exhibiting an increased capacitance at voltages equal to about the charge voltages used to store a charge on the capacitor corresponding to a logic state of the memory cell. For example, when the memory cell is accessed, the voltage on the access line may be about equal to the charging voltage because of the increased capacitance at voltages near the charging voltage. Accordingly, a sense margin of the memory cell may be increased.

Accordingly, a method of operating a volatile memory cell comprises providing a capacitor comprising a crystalline charge storage material comprising an oxide of zirconium and at least one element selected from the group consisting of bismuth, antimony, arsenic, titanium, niobium, aluminum, tantalum, strontium, and lanthanum, transitioning the crystalline charge storage material from a first phase to a second phase exhibiting a higher capacitance than a capacitance of the first phase to store a charge on the capacitor, and accessing the capacitor with an access line coupled to one of a source region and a drain region of the memory cell.

Figure 6:
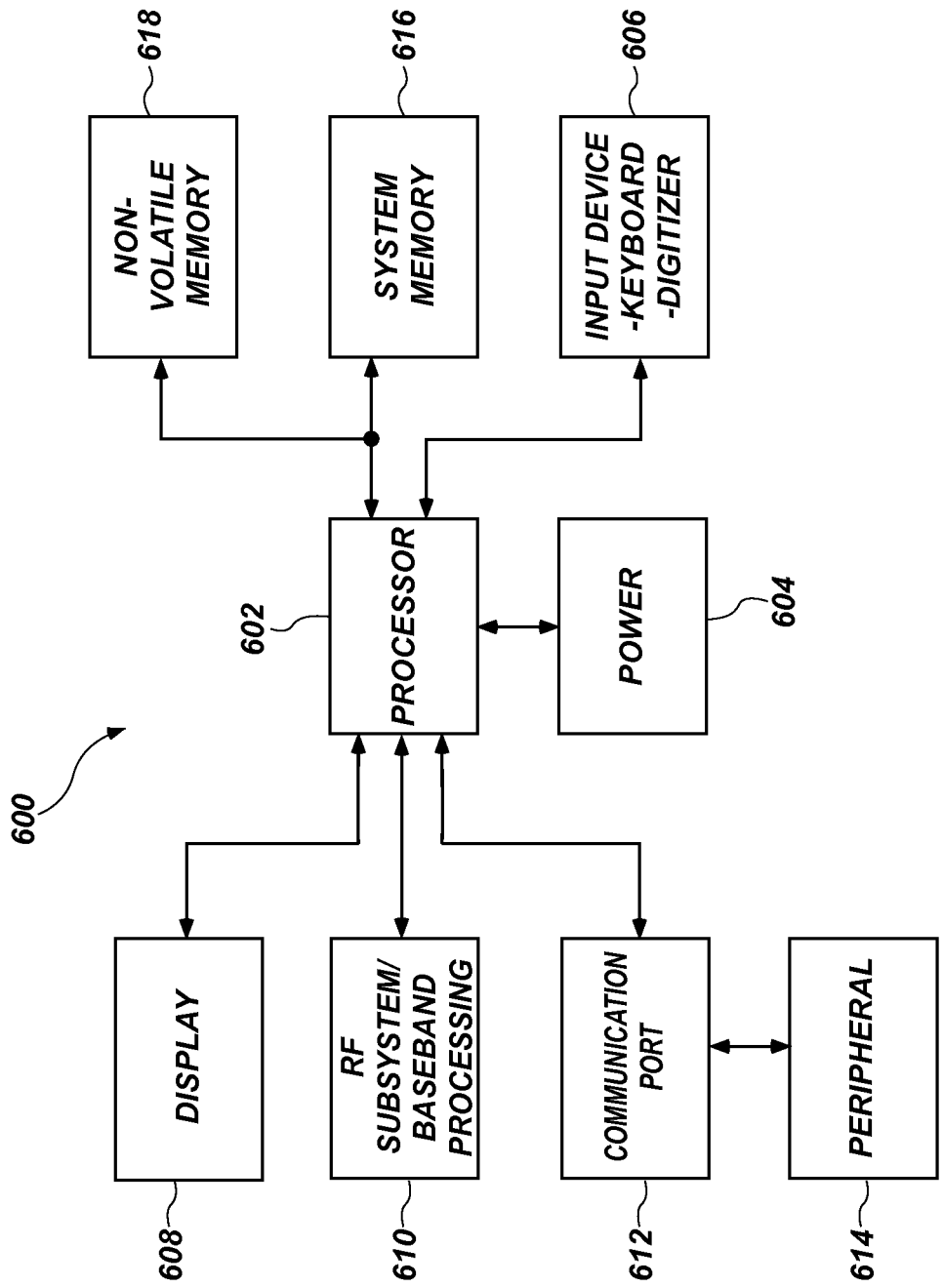
FIG. 6 is a simplified block diagram of a system implemented according to one or more embodiments of the disclosure.

With reference to FIG. 6, depicted is a processor-based system 600. The processor-based system 600 may include various electronic devices manufactured in accordance with embodiments of the present disclosure. The processor-based system 600 may be any of a variety of types such as a computer, camera, pager, cellular phone, wireless device, display, chip set, set-top box, personal organizer, control circuit, or other electronic device. The processor-based system 600 may include one or more processors 602, such as a microprocessor, to control the processing of system functions and requests in the processor-based system 600. The processor 602 and other subcomponents of the processor-based system 600 may include memory cells, memory arrays, and semiconductor devices including the charge storage material exhibiting a nonlinear capacitance with respect to a change in applied voltage in accordance with embodiments of the present disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and rechargeable batteries. The power supply 604 may also include an AC adapter; therefore, the processor-based system 600 may be plugged into a wall outlet, for example. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface 606 may be coupled to the processor 602. The user interface 606 may include input devices such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, an LED display, a three-dimensional projection, an audio display, or a combination thereof. Furthermore, an RF sub-system/baseband processor 610 may also be coupled to the processor 602. The RF sub-system/baseband processor 610 may include an antenna that is coupled to an RF receiver and to an RF transmitter (not shown). A communication port 612, or more than one communication port 612, may also be coupled to the processor 602. The communication port 612 may be adapted to be coupled to one or more peripheral devices 614, such as a modem, a printer, a computer, a scanner, or a camera, or to a network, such as a local area network, remote area network, intranet, or the Internet, for example.

The processor 602 may control the processor-based system 600 by implementing software programs stored in the memory. The software programs may include an operating system, database software, drafting software, word processing software, media editing software, or media playing software, for example. The memory is operably coupled to the processor 602 to store and facilitate execution of various programs. For example, the processor 602 may be coupled to system memory 616, which may include one or more types of volatile memory, such as dynamic random-access memory (DRAM). The system memory 616 may further include other types of volatile memory, non-volatile memory, or a combination thereof. In some embodiments, the system memory 616 may include semiconductor devices, such as the semiconductor devices including memory cells and memory arrays including the charge storage materials described above.

The processor 602 may also be coupled to non-volatile memory 618. The non-volatile memory 618 may include one or more of STT-MRAM, MRAM, read-only memory (ROM) such as an EPROM, resistive read-only memory (RROM), and Flash memory to be used in conjunction with the system memory 616. The size of the non-volatile memory 618 is typically selected to be just large enough to store any necessary operating system, application programs, and fixed data. Additionally, the non-volatile memory 618 may include a high capacity memory such as disk drive memory, such as a hybrid-drive including resistive memory or other types of non-volatile solid-state memory, for example.

Accordingly, a system comprises a semiconductor device comprising an array of memory cells. Each memory cell of the array of memory cells comprises a source region and a drain region within a substrate, a capacitor coupled to one of the source region and the drain region, the capacitor including a charge storage material having a crystal structure comprising an oxide of zirconium and at least another element, the charge storage material configured and formulated to transition from a first phase to a second phase when exposed to a voltage sufficient to store a charge on the memory cell, the second phase exhibiting a higher capacitance than the first phase, and a digit line electrically coupled to an electrode of the capacitor.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A volatile memory cell, comprising:
a source region and a drain region within a substrate;
a capacitor coupled to one of the source region and the drain region, the capacitor including a charge storage material disposed between a pair of electrodes and having a crystal structure comprising an oxide of zirconium, hafnium, and bismuth, the charge storage material configured and formulated to transition from a first crystal structure to a second crystal structure exhibiting a higher capacitance than the first crystal structure responsive to an applied electrical field during use and operation of the volatile memory cell, wherein the charge storage material exhibits a nonlinear capacitance as a function of the applied electrical field, wherein the charge storage material exhibits hysteresis responsive to exposure to one of a positive voltage and a negative voltage and does not exhibit hysteresis responsive to exposure to the other of the positive voltage and the negative voltage; and
a digit line electrically coupled to at least one electrode of the pair of electrodes and one of the source region and the drain region.

2. The volatile memory cell of claim 1, wherein the charge storage material further comprises at least one of titanium, niobium, aluminum, tantalum, strontium, or lanthanum.

3. The volatile memory cell of claim 1, wherein the charge storage material further comprises aluminum.

4. The volatile memory cell of claim 1, wherein the charge storage material comprises one of crystalline zirconium hafnium bismuth oxide and crystalline bismuth aluminum zirconium hafnium oxide.

5. The volatile memory cell of claim 1, wherein the charge storage material further comprises at least one dopant, wherein the at least one dopant does not occupy a lattice site of the first crystal structure or of the second crystal structure.

6. The volatile memory cell of claim 5, wherein the at least one dopant is selected from the group consisting of tantalum, strontium, niobium, magnesium, lanthanum, gadolinium, calcium, bismuth, barium, titanium, hafnium, aluminum, and silicon.

7. The volatile memory cell of claim 1, wherein the charge storage material further comprises at least one of arsenic or antimony.

8. The volatile memory cell of claim 1, wherein the first crystal structure of the charge storage material comprises a tetragonal crystal structure and the second crystal structure comprises an orthorhombic crystal structure.

9. The volatile memory cell of claim 1, wherein the charge storage material comprises between about 1 atomic percent and about 10 atomic percent of at least one of bismuth or aluminum.

10. The volatile memory cell of claim 1, wherein the charge storage material is configured and formulated to transition from the first crystal structure to the second crystal structure responsive to application of a bias voltage having a predetermined magnitude, the charge storage material transitioning to the second crystal structure when exposed to either of a positive bias voltage having the predetermined magnitude or a negative bias voltage having the predetermined magnitude.

11. The volatile memory cell of claim 1, wherein the charge storage material is configured and formulated to exhibit an increased capacitance at a voltage corresponding to a logic state of 0, an increased capacitance at a voltage corresponding to a logic state of 1, and a reduced capacitance at voltages therebetween.

12. The volatile memory cell of claim 1, wherein the charge storage material is doped with about one atomic percent niobium or about two atomic percent niobium.

13. The volatile memory cell of claim 1, wherein the charge storage material is doped with bismuth and aluminum.

14. The volatile memory cell of claim 1, wherein the charge storage material comprises at least about 3 zirconium atoms for every hafnium atom.

15. The volatile memory cell of claim 1, wherein the capacitor consists of the charge storage material and the pair of electrodes.

16. The volatile memory cell of claim 1, wherein the charge storage material exhibits hysteresis responsive to exposure to a negative voltage having a magnitude greater than about 0.25 V and does not exhibit hysteresis responsive to exposure to a positive voltage greater than about 0.25 V.

17. A semiconductor device, comprising
a memory array including volatile memory cells, at least one volatile memory cell of the volatile memory cells comprising:
a gate electrode adjacent to a source region and a drain region within a substrate; and
a capacitor coupled to one of the source region and the drain region, the capacitor configured to store a charge corresponding to logic states of the memory cell, the capacitor comprising:
a top electrode;
a bottom electrode; and
a charge storage material configured and formulated to transition from a first phase exhibiting dielectric properties to a second phase exhibiting antiferroelectric properties responsive to exposure to an electric field during use and operation of the semiconductor device, the second phase exhibiting a higher capacitance than the first phase, wherein the charge storage material exhibits a nonlinear capacitance as a function of voltage at a voltage between about −0.8 V and about 0.8 V.

18. The semiconductor device of claim 17, wherein the charge storage material exhibits a reduced capacitance at a voltage corresponding to about $V_{cc}/2$.

19. The semiconductor device of claim 17, wherein the charge storage material exhibits the higher capacitance at a voltage having a magnitude larger than a voltage at which the charge storage material exhibits the first phase.

20. The semiconductor device of claim 17, wherein the charge storage material comprises at least one dopant.

21. The semiconductor device of claim 17, wherein the charge storage material comprises an oxide of zirconium, hafnium, and at least one more element.

22. The semiconductor device of claim 21, wherein the charge storage material further comprises a dopant comprising at least one of aluminum or niobium.

23. The semiconductor device of claim 21, wherein the at least one more element comprises bismuth.

24. The semiconductor device of claim 17, wherein the charge storage material is one of a paraelectric material, an antiferroelectric material, or a phase-changing material.

25. A method of operating a memory cell, the method comprising:
providing a capacitor comprising a crystalline charge storage material comprising an oxide of zirconium, hafnium, and at least one element selected from the group consisting of bismuth, antimony, arsenic, titanium, niobium, aluminum, tantalum, strontium, and lanthanum, wherein the crystalline charge storage material exhibits hysteresis responsive to exposure to one of a positive voltage and a negative voltage and does not exhibit hysteresis responsive to exposure to the other of the positive voltage and the negative voltage;
responsive to application of a voltage to the capacitor, transitioning the crystalline charge storage material from a first phase to a second phase that is relatively less stable than the first phase and exhibiting a higher capacitance than a capacitance of the first phase to store a charge on the capacitor;
accessing the capacitor with an access line coupled to one of a source region or a drain region of the memory cell; and
responsive to removing the voltage from the capacitor, transitioning the crystalline charge storage material from the second phase that is relatively less stable than the first phase to the first phase.

26. The method of claim 25, wherein providing a capacitor comprising a crystalline charge storage material comprising an oxide of zirconium, hafnium, and at least one element selected from the group consisting of bismuth, antimony, arsenic, titanium, niobium, aluminum, tantalum, strontium, and lanthanum comprises providing a capacitor comprising bismuth hafnium zirconium oxide.

27. A system comprising:
a semiconductor device comprising an array of memory cells, each memory cell of the array of memory cells comprising:
a source region and a drain region within a substrate;
a capacitor coupled to one of the source region and the drain region, the capacitor including a charge storage material having a crystal structure comprising an oxide of zirconium and at least another element, the charge storage material configured and formulated to transition from a first phase to a second phase when exposed to a voltage sufficient to store a charge on the memory cell, the second phase exhibiting a higher capacitance than the first phase, wherein the charge storage material exhibits substantially no change in polarization responsive to exposure to a voltage having a magnitude less than about 0.5 V and exhibits an increase in polarization responsive to exposure to a voltage greater than about 0.5 V; and a digit line electrically coupled to an electrode of the capacitor.

28. The system of claim 27, wherein the charge storage material comprises an oxide of zirconium, hafnium, bismuth, aluminum, and lanthanum.

29. The system of claim 27, wherein the charge storage material is doped or alloyed with at least two additional elements.

30. A volatile memory cell, comprising:

a source region and a drain region within a substrate;

a capacitor coupled to one of the source region and the drain region, the capacitor including a charge storage material disposed between a pair of electrodes and having a crystal structure configured and formulated to transition from a first phase to a second phase exhibiting a higher capacitance than the first phase responsive to application of an electrical field during use and operation of the volatile memory cell, the charge storage material selected from the group consisting of bismuth aluminum zirconium hafnium oxide ($BiAlZrHfO_x$), $Al_wZr_xHf_{(1-w-x-y)}A_yO_z$, and $Al_wZr_xHf_{(1-w-x-y)}Nb_vA_yO_z$, wherein v and w are independently between about 0.01 and about 0.99, x is between about 0.6 and about 1, y is between about 0.01 and about 0.20, and z is between about 1 and about 3, and a digit line electrically coupled to at least one electrode of the pair of electrodes and one of the source region and the drain region.

* * * * *